US010607963B2

(12) United States Patent
Brunschwiler et al.

(10) Patent No.: US 10,607,963 B2
(45) Date of Patent: Mar. 31, 2020

(54) CHIP PACKAGE FOR TWO-PHASE COOLING AND ASSEMBLY PROCESS THEREOF

(71) Applicant: International Business Machines Corporation, Armonk, NY (US)

(72) Inventors: Thomas J. Brunschwiler, Thalwil (CH); Timothy Joseph Chainer, Putnam Valley, NY (US); Evan George Colgan, Montvale, NJ (US); Michael Anthony Gaynes, Vestal, NY (US); Jeffrey Donald Gelorme, Burlington, CT (US); Gerard McVicker, Stormville, NY (US); Ozgur Ozsun, Kilchberg (CH); Pritish Ranjan Parida, Fishkill, NY (US); Mark Delorman Schultz, Ossining, NY (US); Bucknell C. Webb, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/266,786

(22) Filed: Sep. 15, 2016

(65) Prior Publication Data
US 2018/0076113 A1    Mar. 15, 2018

(51) Int. Cl.
*H01L 25/065*    (2006.01)
*H01L 23/00*    (2006.01)
(Continued)

(52) U.S. Cl.
CPC ...... *H01L 25/0655* (2013.01); *H01L 21/4803* (2013.01); *H01L 23/473* (2013.01); *H01L 24/32* (2013.01); *H01L 24/83* (2013.01); *H01L 23/433* (2013.01); *H01L 2224/16225* (2013.01); *H01L 2224/32225* (2013.01); *H01L 2224/73253* (2013.01); *H01L 2224/83201* (2013.01)

(58) Field of Classification Search
CPC ....... H01L 23/427; H01L 23/10; H01L 23/34; H01L 23/433; H01L 25/0655; H01L 23/473
See application file for complete search history.

(56) References Cited

U.S. PATENT DOCUMENTS 5,038,196 A * 8/1991 Fukushima ............. H01L 24/83
156/330.9
5,177,667 A * 1/1993 Graham .............. H01L 23/4336
257/714

(Continued)

OTHER PUBLICATIONS

3M™ Thermally Conductive Adhesive Transfer Tapes datasheet, Jul. 2015.*

(Continued)

*Primary Examiner* — Cuong Q Nguyen
*Assistant Examiner* — Shih Tsun A Chou
(74) *Attorney, Agent, or Firm* — Amin, Turocy & Watson, LLP

(57) ABSTRACT

Devices that have integrated cooling structures for two-phase cooling and methods of assembly thereof are provided. In one example, a chip manifold can be affixed to a chip. An interface can be located at a first position between the chip manifold and the manifold cap. Furthermore, the interface can create a seal.

12 Claims, 12 Drawing Sheets

(51) Int. Cl.
*H01L 21/48* (2006.01)
*H01L 23/473* (2006.01)
*H01L 23/433* (2006.01)

(56) References Cited

U.S. PATENT DOCUMENTS

| | | | | |
|---|---|---|---|---|
| 5,880,524 | A * | 3/1999 | Xie | H01L 23/427 257/704 |
| 6,225,695 | B1 * | 5/2001 | Chia | H01L 29/0657 257/706 |
| 6,351,384 | B1 * | 2/2002 | Daikoku | F28F 3/02 165/80.3 |
| 6,665,187 | B1 * | 12/2003 | Alcoe | H01L 23/10 165/185 |
| 6,748,350 | B2 * | 6/2004 | Rumer | H01L 23/34 257/706 |
| 6,848,172 | B2 * | 2/2005 | Fitzgerald | H01L 23/367 257/E23.102 |
| 7,015,572 | B2 | 3/2006 | Yamaji | |
| 7,544,542 | B2 * | 6/2009 | Too | H01L 23/10 438/125 |
| 7,990,711 | B1 * | 8/2011 | Andry | H01L 23/147 165/80.4 |
| 8,247,895 | B2 | 8/2012 | Haensch et al. | |
| 8,410,802 | B2 * | 4/2013 | Gupta | F28F 23/00 324/750.01 |
| 8,421,220 | B2 | 4/2013 | Knickerbocker et al. | |
| 8,546,930 | B2 * | 10/2013 | Bakir | H01L 23/3677 257/686 |
| 9,220,183 | B1 | 12/2015 | Buvid et al. | |
| 9,313,921 | B2 * | 4/2016 | Brunschwiler | H01L 23/367 |
| 9,431,316 | B2 * | 8/2016 | Pagaila | H01L 21/565 |
| 2005/0141195 | A1 * | 6/2005 | Pokharna | F28F 3/025 361/699 |
| 2006/0043576 | A1 * | 3/2006 | Lee | H01L 23/3677 257/706 |
| 2006/0060328 | A1 * | 3/2006 | Ewes | H01L 23/427 165/80.2 |
| 2006/0268521 | A1 * | 11/2006 | Coffin | H01L 23/34 361/705 |
| 2008/0157345 | A1 * | 7/2008 | Lu | H01L 21/4878 257/712 |
| 2008/0174963 | A1 * | 7/2008 | Chang | F28D 15/0233 361/700 |
| 2009/0057882 | A1 * | 3/2009 | Gerbsch | H01L 23/473 257/714 |
| 2009/0140417 | A1 * | 6/2009 | Refai-Ahmed | H01L 23/3732 257/707 |
| 2009/0283902 | A1 * | 11/2009 | Bezama | H01L 23/3675 257/713 |
| 2009/0284921 | A1 * | 11/2009 | Colgan | H01L 23/473 361/699 |
| 2009/0296354 | A1 * | 12/2009 | Tomioka | G06F 1/20 361/719 |
| 2011/0037167 | A1 * | 2/2011 | Iruvanti | H01L 23/10 257/713 |
| 2011/0272824 | A1 * | 11/2011 | Pagaila | H01L 21/565 257/777 |
| 2012/0267077 | A1 * | 10/2012 | Dede | H05K 7/20936 165/104.21 |
| 2013/0062752 | A1 * | 3/2013 | Lin | H01L 23/16 257/729 |
| 2013/0285233 | A1 * | 10/2013 | Bao | H01L 23/427 257/706 |
| 2013/0292455 | A1 * | 11/2013 | Brofman | B23K 31/02 228/219 |
| 2013/0328184 | A1 * | 12/2013 | Iwayama | H01L 23/15 257/712 |
| 2014/0061890 | A1 * | 3/2014 | Lee | H01L 23/367 257/701 |
| 2015/0171028 | A1 * | 6/2015 | Jo | H01L 23/562 257/713 |
| 2015/0221613 | A1 | 8/2015 | Andry et al. | |
| 2016/0056089 | A1 * | 2/2016 | Taniguchi | H01L 25/0657 257/714 |
| 2016/0111350 | A1 * | 4/2016 | Chen | H01L 23/473 165/80.4 |
| 2016/0233141 | A1 * | 8/2016 | Hirobe | H01L 23/3675 |
| 2016/0268373 | A1 * | 9/2016 | Ko | H01L 27/14618 |
| 2016/0322280 | A1 * | 11/2016 | Schmit | H01L 23/473 |
| 2017/0179001 | A1 * | 6/2017 | Brunschwiler | H01L 23/427 |
| 2017/0358542 | A1 * | 12/2017 | Yeh | H01L 23/562 |

OTHER PUBLICATIONS

Hysol FP5300 Technical Data Sheet, Apr. 2011.*
O-ring, Wikipedia, archived Feb. 21, 2015 (Year: 2015).*

* cited by examiner

CHIP PACKAGE FOR TWO-PHASE COOLING AND ASSEMBLY PROCESS THEREOF

STATEMENT REGARDING FEDERALLY SPONSORED RESEARCH OR DEVELOPMENT

This invention was made with Government support under Contract No.: FA8650-14-C-7466 awarded by Defense Advanced Research Projects Agency (DARPA). The Government has certain rights in this invention.

BACKGROUND

The subject disclosure relates to chip package architecture and assembly, and more specifically, to chip packages having an integrated two-phase cooling structure and the manufacturing thereof.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices and methods for a two-phase cooling chip package are described.

According to an embodiment, a device is provided. The device can comprise a chip manifold, a chip, an interface, and a manifold cap. The chip manifold can be affixed to the chip. The interface can be located at a first position between the chip manifold and the manifold cap. Furthermore, the interface can create a seal.

According to another embodiment, a method is provided. The method can comprise affixing a chip manifold to a chip. An interface can be applied at a first position on the chip manifold. Furthermore, a manifold cap can be affixed to the interface such that the interface forms a seal between the manifold cap and the chip manifold.

According to another embodiment, a method is provided. The method can comprise affixing a chip manifold to a chip. An interface can be applied to the chip manifold at a first position and to a substrate at a second position. Furthermore, a manifold cap can be affixed to the interface such that the interface forms a seal between the manifold cap and the chip manifold.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Semiconductor chips and three-dimensional chip stacks can benefit from cooling to maintain reliable and efficient operation while avoiding damage to electronic components. Two-phase cooling is one technique that can be utilized to achieve effective cooling. In two-phase cooling, a liquid coolant flows across an operational chip, or chip stack, and absorbs the chip's dissipating heat. As the liquid coolant absorbs the heat, the coolant evaporates into a vapor and carries the heat away from the chip. Two-phase cooling systems can provide greater cooling ability at a lower volume of coolant, lower mass flow rate, and/or lower operating pressure than single-phase cooling.

Figure 1:
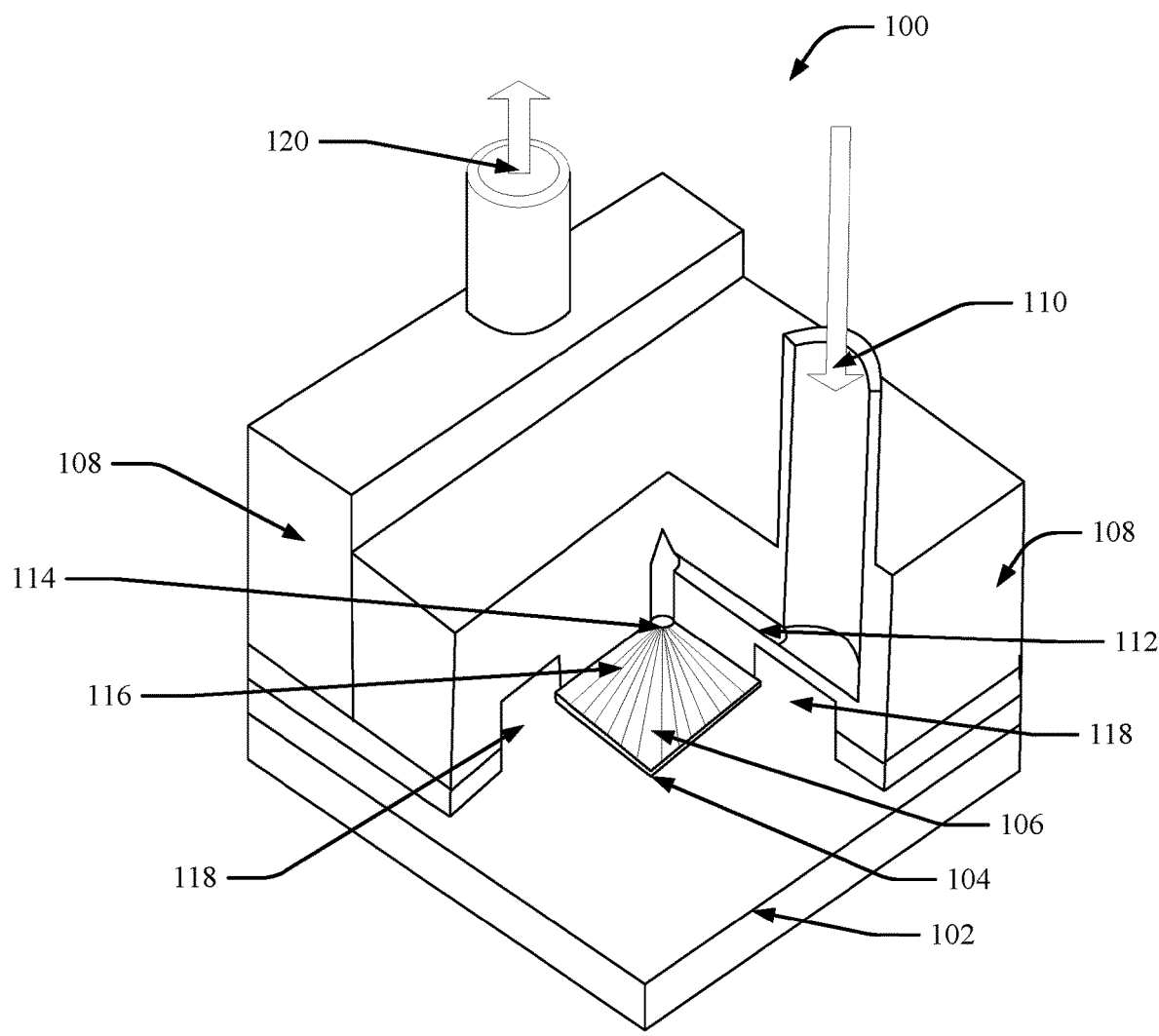
FIG. 1 illustrates a schematic of an example, non-limiting device having an integrated cooling architecture to implement two-phase cooling in accordance with one or more embodiments described herein.

With reference now to FIG. 1, an embodiment is shown wherein a chip package 100 for two-phase cooling is illustrated with a corner of the chip package 100 cut away to render the inner structure visible. The chip package 100 can comprise: a substrate 102, a chip 104, a chip manifold 106, and a manifold cap 108. A dielectric liquid coolant can enter the manifold cap 108 via an inlet opening 110, and traverse an inlet path 112 through the manifold cap 108 to the chip manifold 106. The liquid coolant can pass through the chip manifold 106 via a hole 114 and enter one or more cooling channels 116 on an upper surface of the chip 104. The one or more cooling channels 116 can radially extend away from the center of the chip 104. The liquid coolant can flow through the cooling channels 116 towards the edges of the chip 104 and chip manifold 106. As the coolant flows through the cooling channels 116, the coolant can absorb heat dissipating from the chip 104 and change phase from a liquid to a vapor. Upon reaching the end of the cooling channels 116, the gaseous coolant can escape into an outlet path 118 in the manifold cap 108 and which surrounds the chip 104 and chip manifold 106. The gaseous coolant can flow through the outlet path 118 and exit the chip package 100 via an outlet opening 120.

Figure 2:
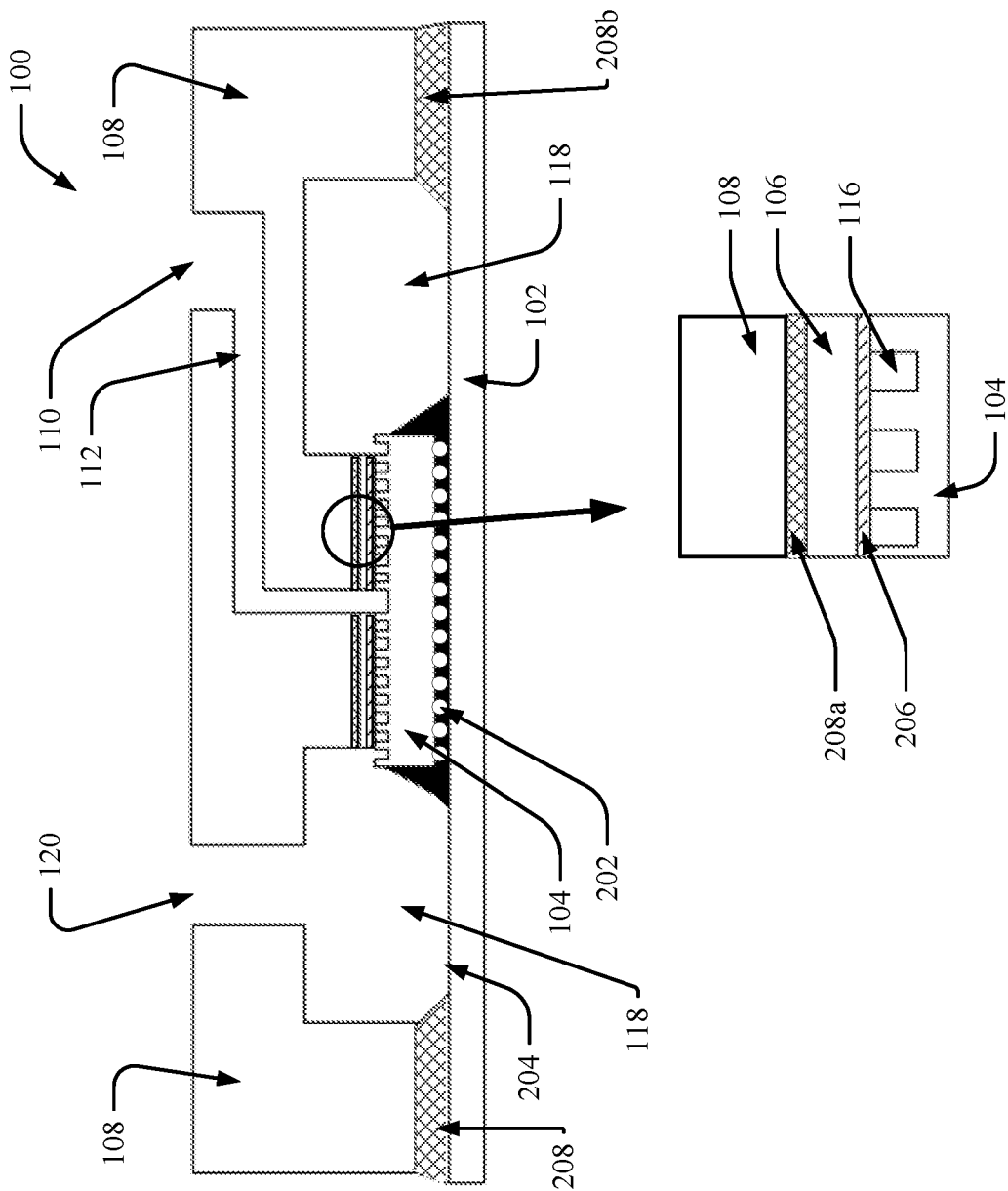
FIG. 2 illustrates a cross-sectional view of an example, non-limiting device having an integrated cooling architecture to implement two-phase cooling in accordance with one or more embodiments described herein.

FIG. 2 illustrates a cross-sectional view of the chip package 100 with a portion of the chip package 100 magnified for more accurate referencing. Repetitive description of like elements employed in other embodiments described herein is omitted for sake of brevity.

The substrate 102 (e.g., an organic substrate) can comprise the base of the chip package 100. The chip 104 (e.g., a silicon chip), or a stack of conjoined chips, can be electrically connected and bonded to the substrate 102 via an array of solder balls 202 (e.g., Lead (Pb)-free controlled collapse chip connections (C4s)). The chip 104 can be underfilled to protect both the solder interconnections and fragile back-end-of-line structure in an area of connection on the chip 104 from cyclic thermal mechanical fatigue failure. The material properties of the cured underfill can result in a strong mechanical bond between the chip 104, with a low coefficient of thermal expansion (CTE) (about 2.9 parts per million (ppm)/degrees Celsius (C°)), and the substrate 102, with a much higher CTE (about 17 ppm/C°)). Further, a laminate 204 can coat an upper most surface of the substrate 102 that faces the manifold cap 108.

Cooling channels 116 can be etched into a surface of the chip 104 farthest from the substrate 102 (e.g., a top surface of the chip 104). In other embodiments, the cooling channels 116 may be etched into other (e.g., intermediary) surfaces of the chip 104. In some embodiments, the cooling channels 116 can form a central feed area aligned with the hole 114 in the chip manifold 106. Further, the cooling channels 116 can extend radially from the central feed area toward the edges of the chip 104. Also, the width of the cooling channels 116 can increase as the cooling channels 116 near one or more of the chip 104 edges. Each channel (or in some embodiments, one or more channels) of the cooling channels 116 can have the same height as the other channels comprising the cooling channels 116. The cooling channels 116 can guide the coolant into a radial flow across the surface of the chip 104.

In some embodiments, the chip manifold 106 can be located on the chip 104 and form a lid over the cooling channels 116. The chip manifold 106 can have a hole 114 aligned with the central feed area created by the cooling channels 116. Further, the chip manifold 106 can cover the entire surface of the chip 104 except for the hole 114 over a defined region (e.g., the center region) of the chip 104. Also, in some embodiments, the chip manifold 106 can stop short of extending entirely to the edges of the chip 104, thereby creating an opening enabling greater fluid communication between the cooling channels 116 and the outlet path 118. In other words, the chip manifold 106 can act as a lid covering the cooling channels 116 and containing the dielectric coolant (in liquid or vapor phase) except over the center feed area and outmost edges of the cooling channels 116.

In some embodiments, the chip manifold 106 can be a thin flexible material having a CTE closely matched to the CTE of the chip 104. Material choices for the chip manifold 106 can include, but are not limited to, thin silicon (<500 microns), thin glass (<200 microns) (e.g., WILLOW GLASS®) and the like. Thus, suitable materials for the chip manifold 106 can include materials that are thin (typically less than 1 millimeter (mm)), flexible, and have similar CTE properties as the chip 104 material. Further, the chip manifold 106 can have a uniform thickness.

The chip manifold 106 can be bonded to the chip 104 by an adhesive layer 206. The adhesive layer 206 can bond the chip manifold 106 to the surface of the chip 104 into which the cooling channels 116 are etched (e.g., the top of the walls defining the cooling channels 116). In some embodiments, the adhesive layer 206 can comprise an adhesive malleable enough to contour with any (or, in some embodiments, one or more) curvatures of the chip manifold 106 and the chip 104. The adhesive layer 206 can be a phenoxy thermoplastic adhesive (e.g., a synthetic thermoplastic in the form of polyhydroxy ethers). For example, the adhesive can comprise a phenoxy polymer containing the chemical ingredient bisphenol-A-(epichlorohydrin) (e.g., PKHC, PKHB, PKHJ, PKHA, and PKHH), or the like in a solvent (e.g., N-Methyl-2-pyrrolidone (NMP), Methyl Ethyl Ketone (MEK), cyclohexanone, and glycol ethers). Also, the adhesive layer can be about 2-5 microns thick (e.g., 3-4 microns).

The manifold cap 108 can interact with the chip manifold 106 and the laminated substrate 102 via an interface 208. The interface 208 can be located in primarily two positions. The first position 208a of the interface 208 can be between the manifold cap 108 and the chip manifold 106. The second position 208b of the interface 208 can be between the manifold cap 108 and the laminated substrate 102. In some embodiments, the interface 208 can encircle the hole 114 on the chip manifold 106 at the first position 208a and traverse the perimeter of the laminated substrate 102 at the second position 208b.

In some embodiments, the interface 208 can be a rigid high strength, room temperature curing structural adhesive with a modulus of elasticity of about 2 gigapascals (GPa) or more at both the first position 208a and the second position 208b. The interface 208 can comprise about 28-32 milligrams (mg) of adhesive at the first position 208a, wherein the chip 104 can be about 21.2×26.6 mm in size, and about 500-600 mg of adhesive at the second position 208b, wherein the substrate 102 can be about 50×50 mm and the manifold cap can be about 48×48 mm in size. Also, it is understood that the mass dispense of the adhesive can be adjusted for various design dimensions.

Further, in one embodiment, 45 micron spacer beads can be used in the adhesive to achieve a 45 micron bond line minimum at the first position 208a.

In another embodiment, the interface 208 at the first position 208a can be a compliant, elastomeric adhesive with a modulus of about 2 to 15 megapascals (MPa). The interface 208 at the second position 208b can be a rigid high strength, room temperature curing structural adhesive with a modulus of elasticity of about 2 GPa or more. The interface 208 can comprise about 28-32 mg of compliant adhesive at the first position 208a and about 500-600 mg of rigid adhesive at the second position 208b. Spacer beads larger than 45 microns can be used to facilitate compliance in the structure with a corresponding increase in the mass of adhesives dispensed at the first position 208a and the second position 208b.

In another embodiment, the interface 208 at the first position 208a can be a compliant, elastomeric pre-cast or pre-cut non-adhesive seal with a modulus of about 2 to 15 MPa, and can be used to provide compressive loading during room temperature curing and provide a large temperature range of thermal mechanical stability of the chip package 100 structure. The interface 208 at the second position 208b can be a rigid high strength, room temperature curing structural adhesive with a modulus of elasticity of about 2 GPa or more. The interface 208 can comprise about 500-600 mg of rigid adhesive at the second position 208b.

The manifold cap 108 (e.g., a manifold typically comprising a brass alloy, a copper alloy, or an aluminum alloy but can comprise a polymer, ceramic or other material) can have at least one inlet opening 110 connected to least one inlet path 112. The inlet path 112 can travel through the manifold cap 108 and align with the hole 114 of the chip manifold 106. As such, a pathway can be created in which dielectric coolant can pass through the manifold cap 108 and the chip manifold 106 to the central feed area and into the cooling channels 116. Further, the manifold cap 108 can have at least one outlet path 118 surrounding the chip 104, adhesive layer 206, chip manifold 106, and first position 208a of the interface 208. The one outlet path 118 can connect to at least one outlet opening 120. As such, a pathway can be created in which heated dielectric coolant (e.g., liquid and/or vapor) can escape the cooling channels 116 and exit the chip package 100.

Figure 3:
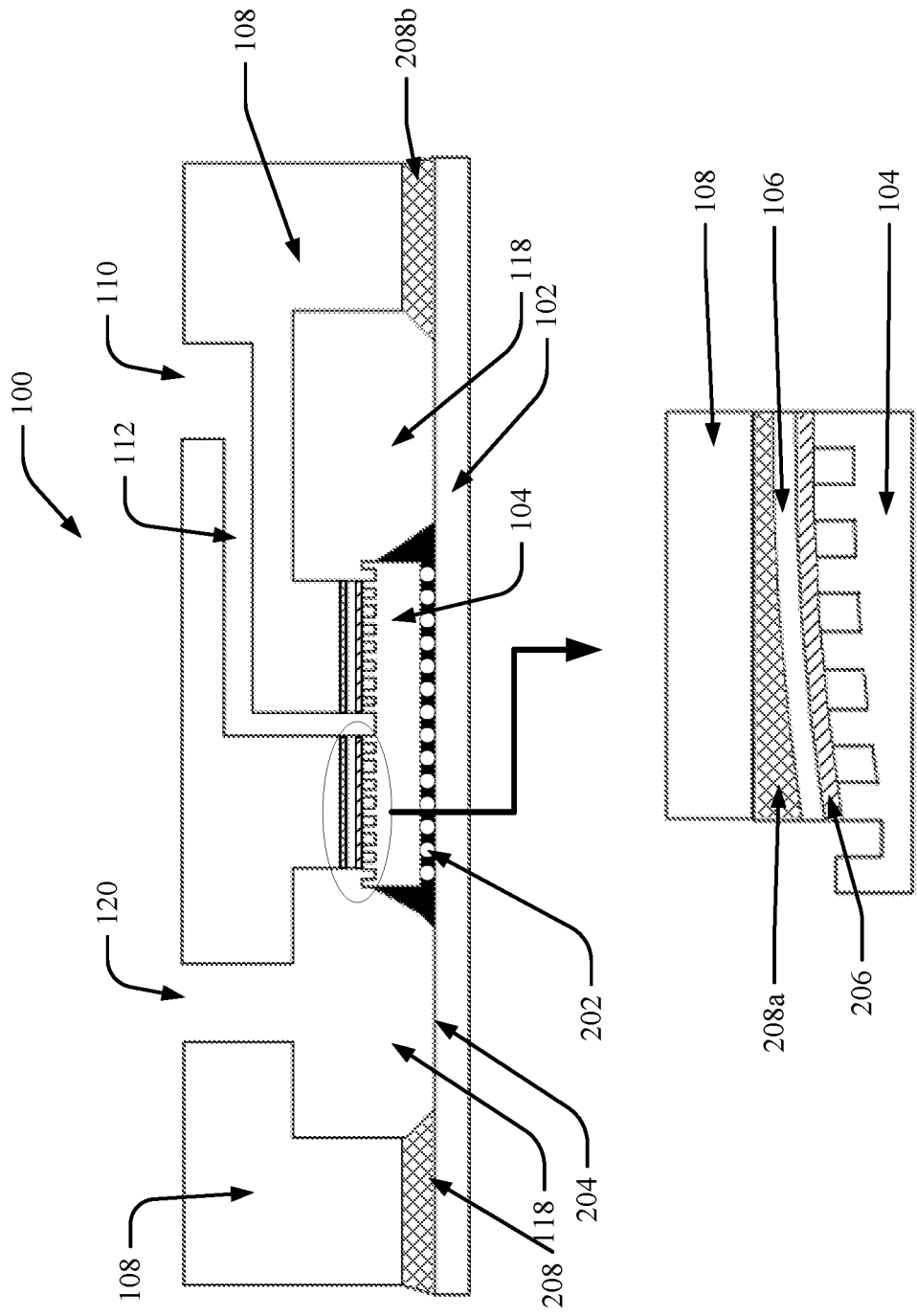
FIG. 3 illustrates a cross-sectional view of an example, non-limiting device that can comprise a two-phase cooling structure with a curved chip and chip manifold in accordance with one or more embodiments described herein.

FIG. 3 illustrates a cross-sectional view of the chip package 100 with a portion of the chip package's 100 structure greatly magnified (identified by a circle and arrow) to show the curvature which may be created by warpage and how one or more embodiments described herein can account for the warpage. Repetitive description of like elements employed in other embodiments described herein is omitted for sake of brevity.

Referring to FIG. 3, during cool down from the underfill cure, warpage can occur as the substrate 102 contracts more than the chip 104. For example, a chip 104 on the order of 25×25 millimeter (mm) mounted on the substrate 102 can warp more than 100 microns from the center of the chip 104 to the edges of the chip 104. In an embodiment, the chip manifold 106 and the adhesive layer 206 bonding the chip manifold 106 to the chip 104 can both have a curvature parallel to the curvature of the chip 104 created by the warpage described above. Thus, the chip manifold 106 and the adhesive layer 206 can bend to match the gradient of the chip 104. However, the surface of the manifold cap 108 that faces the chip manifold 106 can be flat, and not match the curvature (e.g., gradient) of the chip manifold 106, adhesive layer 206, and chip 104. To compensate for the lack of uniformity between the manifold cap 108 surface and the chip manifold 106, the height of the interface 208, at the first position 208a, can thin as it nears the hole 114 at the center of the chip manifold 106. In other words, in one embodiment, the interface 208, at the first position 208a, can be thicker near the edges of the chip manifold 106 (where the chip manifold 106 is furthest from the surface of the manifold cap 108, which faces the chip manifold 106) and thinner near the center chip manifold 106 (where the chip manifold 106 is closest from the surface of the manifold cap 108, which faces the chip manifold 106). The varying thickness of the interface 208, at the first position 208a, can create a complete seal between the manifold cap 108 and the chip manifold 106, despite the convex structure of the chip manifold 106.

Figure 4:
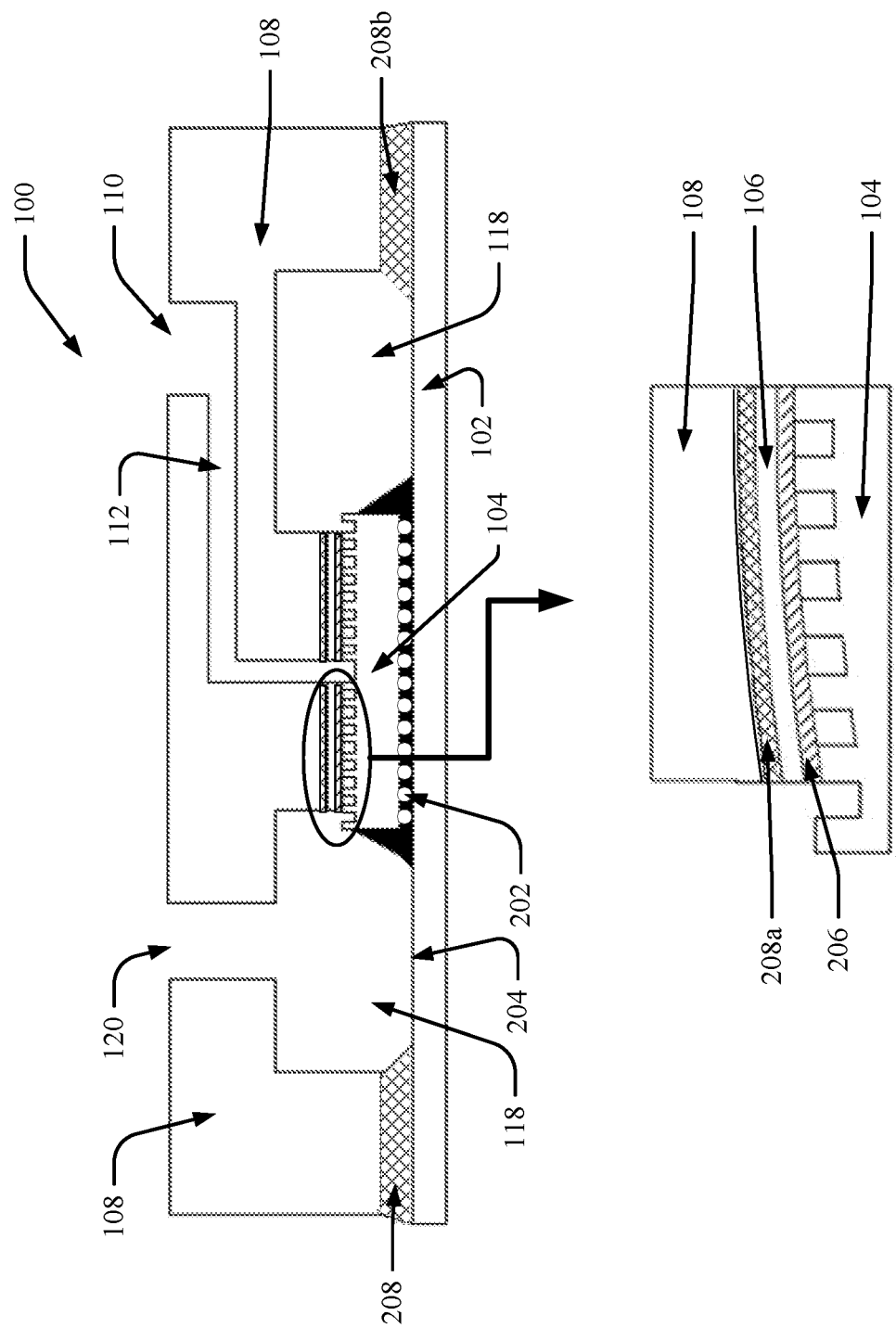
FIG. 4 illustrates a cross-sectional view of an example, non-limiting device that can comprise a two-phase cooling structure with a curved chip, chip manifold and manifold cap in accordance with one or more embodiments described herein.

Referring to FIG. 4, in another embodiment, the surface of the manifold cap 108 which faces the chip manifold 106 can have a curvature which parallels the curvature of the chip manifold 106, adhesive layer 206, and chip 104. Repetitive description of like elements employed in other embodiments described herein is omitted for sake of brevity.

Similarly to FIG. 3, FIG. 4 illustrates a cross-sectional view of the chip package 100 with a portion of the chip package 100 structure greatly magnified (identified by a circle and arrow) to show the curvature which can be created by warpage and how one or more embodiments described herein accounts for the warpage. However, FIG. 4 illustrates the manifold cap 108 with a surface facing the chip manifold 106 that can be curved to match the gradient of the chip manifold 106. The curvature of the manifold cap 108 can allow for a uniform thickness of the interface 208, at the first position 208a.

FIGS. 1-4 illustrate a chip package 100 that can comprise a single chip 104; however, the chip package 100 described herein is not limited to a single chip 104, rather the chip package 100 can comprise a plurality of conjoined chips in electrical communication. In an embodiment, the outlet path 118 can surround a plurality of conjoined chips stacked together and arranged in a vertical orientation (e.g., one chip stacked on another). In another embodiment, the outlet path 118 can surround a plurality of conjoined chips, each chip mounted on the substrate 102 (e.g., conjoined chips arranged in a matrix on the substrate 102). Further, the chip package 100 described herein is not limited to a single inlet opening 110 and inlet path 112 or a single outlet opening 120 and outlet path 118; rather the chip package 100 can comprise a plurality of inlet openings, inlet paths, outlet openings, and outlet paths to facilitate the introduction of coolant from multiple sources to multiple chips and the exit of heated coolant to multiple destinations. Moreover, the inlet path 112 can connect to multiple chips.

Figure 5:
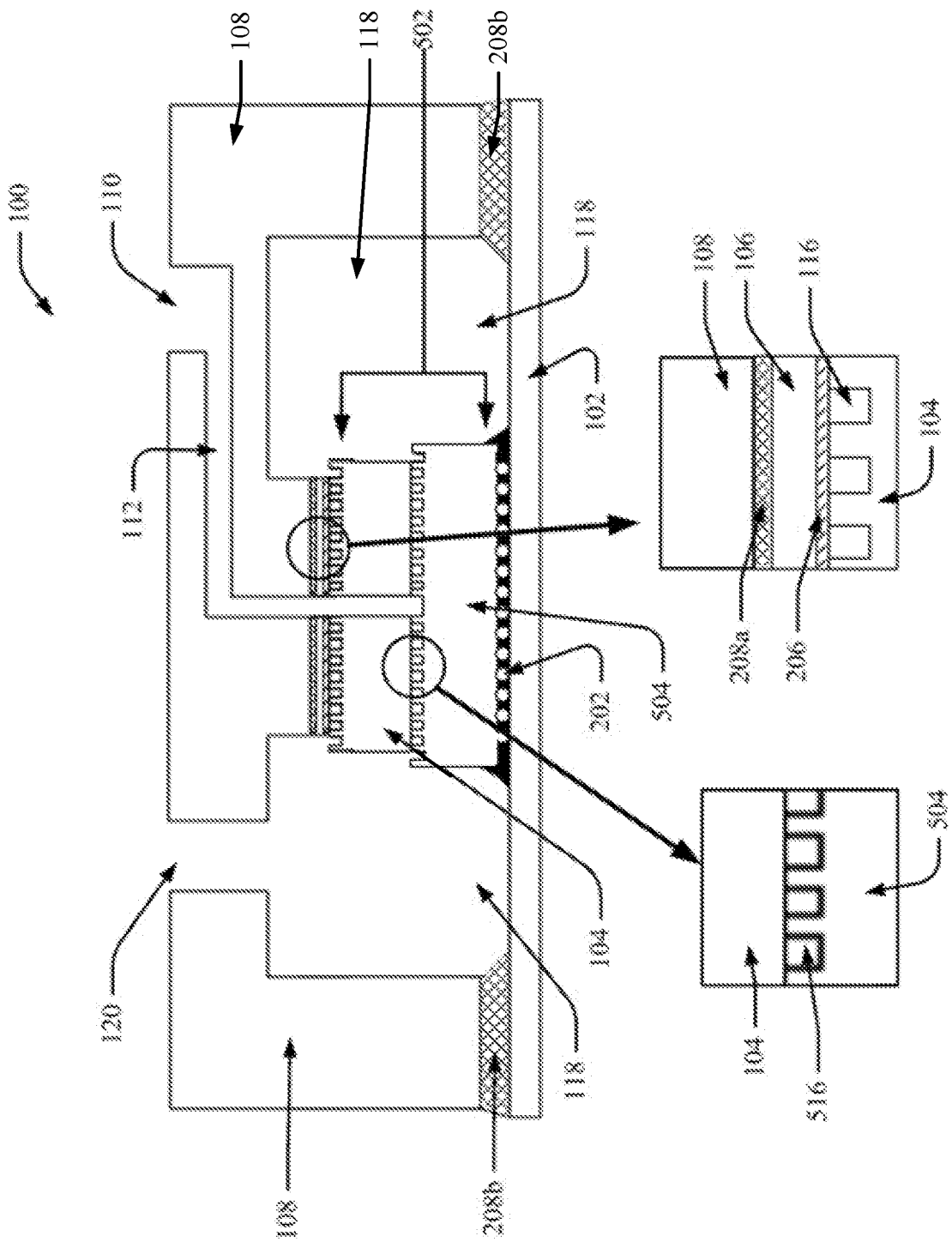
FIG. 5 illustrates a cross-sectional view of an example, non-limiting device having an integrated cooling architecture to implement two-phase cooling with respect to a stack of chips in accordance with one or more embodiments described herein.

For example, FIG. 5 illustrates an embodiment described herein in which the chip package 100 can comprise multiple chips stacked in a vertical orientation. Repetitive description of like elements employed in other embodiments described herein is omitted for sake of brevity.

The stack of chips 502 can comprise at least two chips operatively conjoined, with the chip 104 described above located on top of at least a second chip 504. The chip 104 can be provided power by using through-silicon vias (TSVs) or wire-bonding technology. For example, TSVs passing through the second chip 504 can be used to provide power. Also, the top chip can have a different thickness (e.g. about 100 microns) than the bottom chip (e.g. about 500 microns). In an embodiment, the bottommost chip can be thinner than the chip 104 described above (e.g. about 100 microns).

The bottommost chip in the stack can be operatively mounted to the substrate 102 using underfill and solder balls 202, as described above. The second chip can have a value of length larger than a value of length of the chip 104 described above. The second chip 504 can be fabricated from the same material as the chip 104. Also, the second chip can comprise a second set of cooling channels 516 having the same structure as the cooling channels 116 previously described. The inlet path 112 can pass through the top chip 104 and to the central feed area of the second chip 504, thereby enabling coolant to enter the second set of cooling channels 516 and flow across a surface of the second chip 504 in route to the outlet path 118. While FIG. 5 illustrates a single second chip 504, the chip package 100 described herein can comprise multiple second chips resulting in three or more chips conjoined in a vertical orientation on the substrate 102 and covered by the manifold cap 108.

Figure 6:
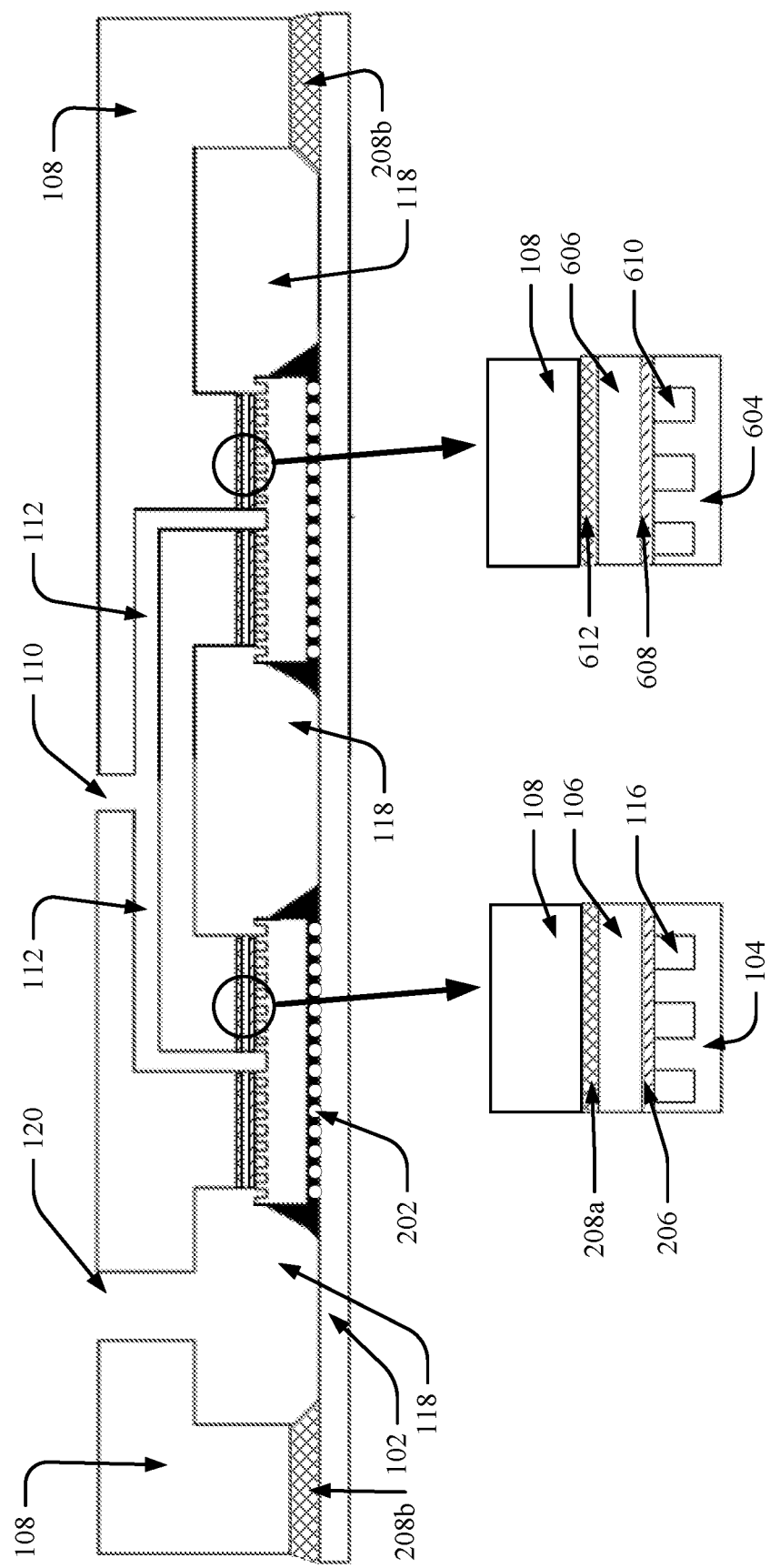
FIG. 6 illustrates a cross-sectional view of an example, non-limiting device having an integrated cooling architecture to implement two-phase cooling with respect to a plurality of chips arranged in a matrix in accordance with one or more embodiments described herein.

FIG. 6 illustrates another embodiment of the present invention in which the chip package 100 can comprise multiple chips arranged in a matrix on the substrate 102. Repetitive description of like elements employed in other embodiments described herein is omitted for sake of brevity.

At least one additional chip 604 can be arranged on the substrate 102 along with the chip 104 described above. The chips can be operatively conjoined via an electrical interface. The additional chip 604 can be mounted to the substrate 102 in the same manner, have the same structure, and can comprise the same material as the chip 104 described with reference to FIGS. 1-4. The additional chip 604 can be bonded to an additional chip manifold 606 via an additional adhesive layer 608. The additional chip manifold 606 can have the same relative dimensions and properties in respect to the additional chip 604 as the chip manifold 106 has in respect to the chip 104 described above. Further, the additional chip manifold 606 can act as a lid to an additional set of cooling channels 610 etched into a top most surface of the additional chip 604. The additional cooling channels 610 can have the same structure as the cooling channels 116 previously described. Also, the additional adhesive layer 608 can have the same features as the adhesive layer 206 described above.

The interface 208 can be located at a third position 612 between the manifold cap 108 and the additional chip manifold 606. The interface 208 at the third position 612 can be the same adhesive or seal as the interface 208 at the first position 208a. Alternatively, the interface 208 at the third position 612 can be a different embodiment of the present invention, as described above, than the interface 208 at the first position 208a (e.g., the interface 208 can be a compliant adhesive at position 612 and a pre-cast seal at position 208a).

In reference to FIG. 6, the inlet path 112 can split in multiple directions, with each direction (or, in some embodiments, one or more directions) leading to a different chip manifold (e.g., 106 or 606). In an embodiment of the present invention, the manifold cap 108 can comprise of a fluid delivery network having a plurality of inlet paths 112 to distribute the coolant flow among all the chips. Also, an additional channel to the outlet path 118 can enable the outlet path 118 to surround multiple chips mounted to the substrate 102.

While FIG. 6 illustrates a single additional chip, the chip package 100 described herein can have multiple additional chips resulting in three or more conjoined chips in a matrix formation on the substrate 102 and covered by the manifold cap 108. The additional chip 604 can be subject to the similar warpage as the chip 104 described above. In another embodiment, the additional chip 604 can have a different gradient of curvature than the gradient of curvature of the chip 104 described above. However, the structure and embodiments of the present invention described above with reference to FIGS. 1-4 are applicable to any chip in the matrix.

Figure 7:
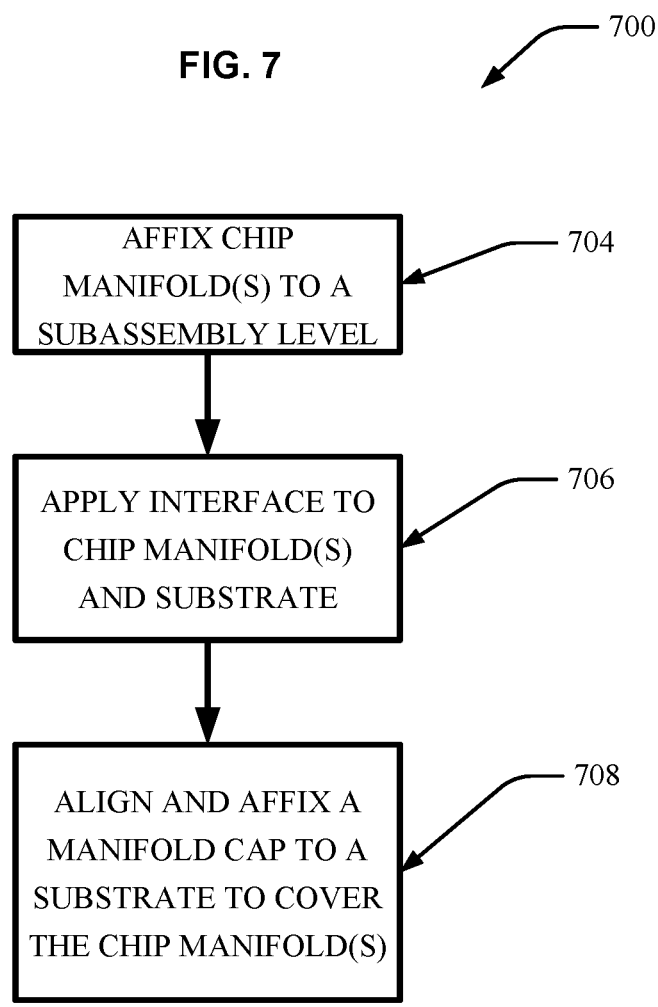
FIG. 7 illustrates a flow diagram of an example, non-limiting method that facilitates assembly of a device that having an integrated cooling architecture to implement two-phase cooling in accordance with one or more embodiments described herein.

FIG. 7 shows a flow diagram of a method 700 for manufacturing the chip package 100 described above with reference to FIGS. 1-6. Repetitive description of like elements employed in other embodiments described herein is omitted for sake of brevity.

At least one chip manifold can be prepared and coated with an adhesive. The chip package 100 can comprise a single chip, as illustrated in FIGS. 1-4, or a stack of conjoined chips, as illustrated in FIG. 5, in which the chip manifold 106 can be cut from a chip manifold material coated with the adhesive layer 206. The chip package 100 can comprise multiple chips arranged in a matrix formation, as depicted in FIG. 6, in which a respective chip manifold (e.g., the chip manifold 106 and the additional chip manifold 606) can be cut from a chip manifold material coated with an adhesive (e.g., adhesive layer 206 and additional adhesive layer 608) for each of the chips in the matrix.

In 704, the one or more chip manifolds can be affixed to a subassembly level. The subassembly level can comprise one or more chips mounted to the substrate 102. The one or more chip manifolds can be affixed to the one or more chips such that each respective chip manifold matches the gradient of the chip to which the chip manifold can be affixed.

In 706, the interface 208 can be applied to the one or more chip manifolds (e.g., at the first position 208a and the third position 612) and the substrate 102. The interface 208 can be applied onto each of the one or more chip manifolds such that the interface 208 surrounds a hole (e.g., the hole 114) located in each of the one or more chip manifolds.

In 708, the manifold cap 108 can be aligned and affixed to the substrate 102. The manifold cap 108 can be affixed to the substrate 102 via the interface 208 at the second position 208b. The manifold cap 108 can also be affixed to the one or more chip manifolds via the interface 208 (e.g., at the first position 208a and the third position 612).

Figure 8:
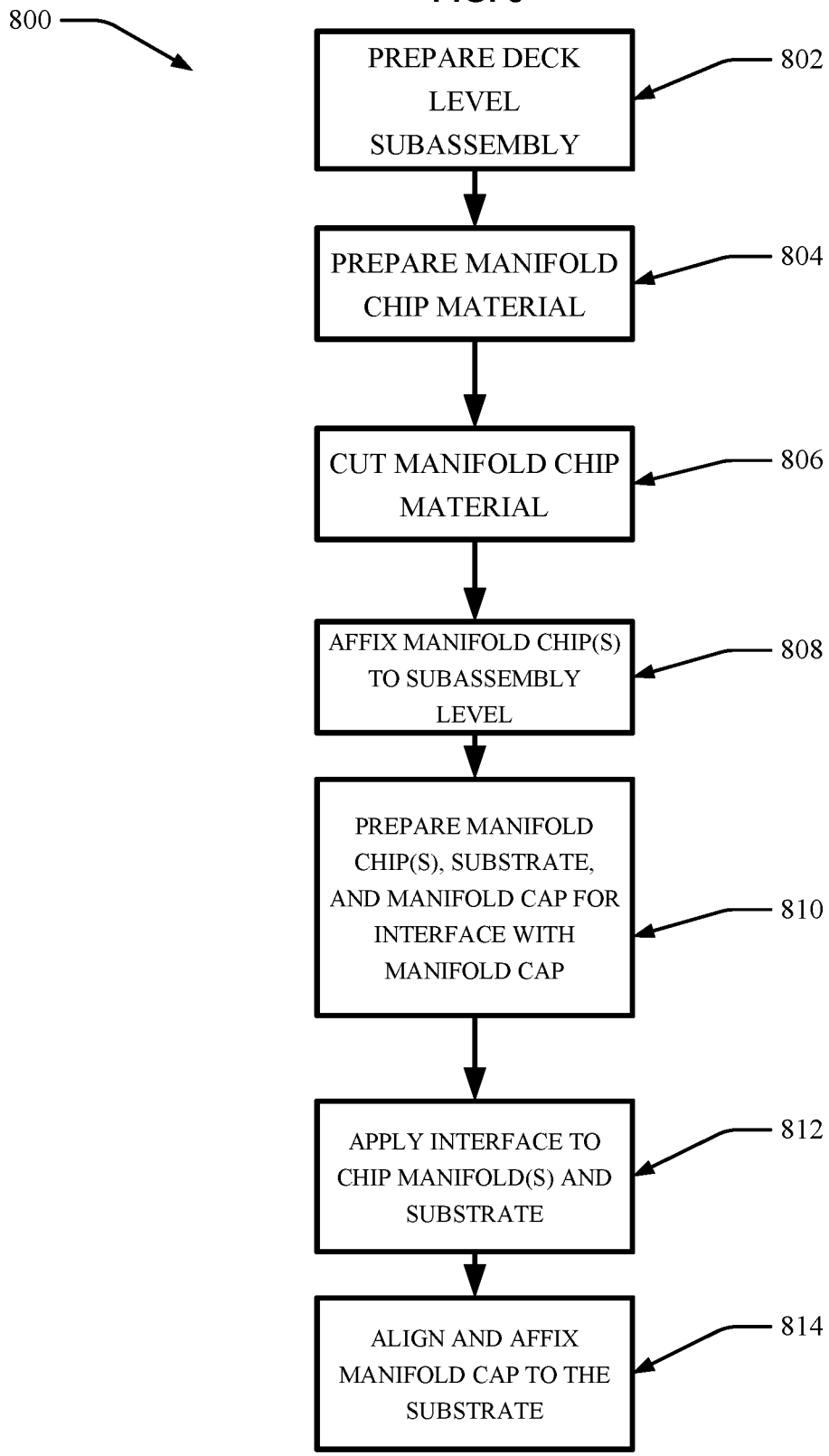
FIG. 8 illustrates a flow diagram of an example, non-limiting method that facilitates assembly of a device having an integrated cooling architecture to implement two-phase cooling in accordance with one or more embodiments described herein.

FIG. 8 shows a flow diagram of a method 800 for manufacturing the chip package 100 described above with reference to FIGS. 1-4. Repetitive description of like elements employed in other embodiments described herein is omitted for sake of brevity.

In 802, the deck level subassembly can be prepared. For example, the chip 104 (e.g., silicon chip) can be mounted to the substrate 102 by underfilling the chip 104 in conjunction with solder interconnections (e.g., Pb free C4s). As described above, during cool down from the underfill cure, warpage of the chip 104 can occur as the substrate 102 contracts more than the chip 104. Additionally, the radial cooling channels 116 can be etched into the top most surface of the chip 104. Thus, the chip 104 can be mounted to the substrate 102, with the chip 104 having a convex shape with center of the chip 104 curving away from the substrate 102.

In 804, the chip manifold 106 can be prepared. The chip manifold material can be cleaned prior to application of the adhesive layer 206. For example, oxygen plasma treatment of the chip manifold material before coating with the adhesive layer 206 can help to clean and to enhance coating, wetting, and adhesion. Next, the adhesive layer 206 can be applied to the chip manifold material. For example, the adhesive layer 206 can be applied using spin coating or spray coating techniques. Then the coated manifold material can be baked to remove solvent used in fabrication of the adhesive in the adhesive layer 206.

In 806, the chip manifold material can be cut to the dimensions of the chip manifold 106, including the hole 114 in the chip manifold 106 which acts as an inlet for coolant into the central feed area created by the cooling channels 116, as described above. The chip manifold material can be cut to dimensions slightly shorter than the dimensions of the chip 104 with the hole 114 cut into the chip manifold material in a position which will align with the central feed area of the cooling channels 116. By cutting the chip manifold material to dimensions slightly shorter than the chip 104, the edges of the cooling channels 116 can not be covered by the chip manifold 106, thereby allowing heated coolant greater access to the outlet path 118.

In 808, the chip manifold 106 can be aligned and affixed to a surface of the chip 104 (e.g., the subassembly level) furthest from the substrate 102 (e.g., the top most surface) into which the cooling channels 116 can be etched. Pressure can be applied to the chip manifold 106 during curing of the adhesive layer 206 such that the chip manifold 106 bends to match the curvature of the chip 104 created by warpage.

In 810, the chip manifold 106 and the substrate 102 can be prepared for interface with the manifold cap 108. The chip manifold 106 and the substrate 102 can be cleaned prior to application of the interface 208. For example, oxygen plasma treatment of the chip manifold 106 and the substrate 102 before application of the interface 208 can help to clean and to enhance coating, wetting, and adhesion. Further, the manifold cap 108 can be cleaned using, for example, ultrasonic cleaning techniques. Also, the top most surface of the substrate 102 can be laminated.

In 812, the interface 208 can be applied to first position 208a on the chip manifold 106 and to a second position 208b on the substrate 102. Wherein the interface 208 can be an adhesive at the first position 208a, the adhesive can be applied in a pattern to achieve maximum coverage while avoiding any overflow into the cooling channels 116 or central feed area. Wherein the interface 208 can be a pre-cast or pre-cut seal, the seal can be positioned so as to surround the hole 114 in the chip manifold 106. As described above in regards to the structure of the chip package 100, the interface 208, at the first position 208a, can be any one of a rigid adhesive, a compliant adhesive, or a pre-cast or pre-cut non-adhesive seal.

In 814, the manifold cap 108 can be aligned and affixed to the substrate 102. An alignment fixture can surround the substrate 102 to ensure the manifold cap 108 is properly aligned during affixing. Through use of the alignment fixture, lateral movement can be avoided as with manual placement. Any lateral movement of the manifold cap 108 after it is placed can risk moving the interface 208 into the hole 114 in the chip manifold 106 or the outlet path 118. Wherein the interface 208 can be an adhesive at the first position 208a, the interface can be cured at room temperature to avoid a tug-of-war on the adhesive bond between the chip manifold 106 and the chip 104. Otherwise, for a thermally cured interface, upon cooling to room temperature after cure, the warped chip 104 structure could pull the chip manifold 106 down while the manifold cap 108 could pull the chip manifold 106 up, causing high stress on the adhesive layer 206.

Figure 9:
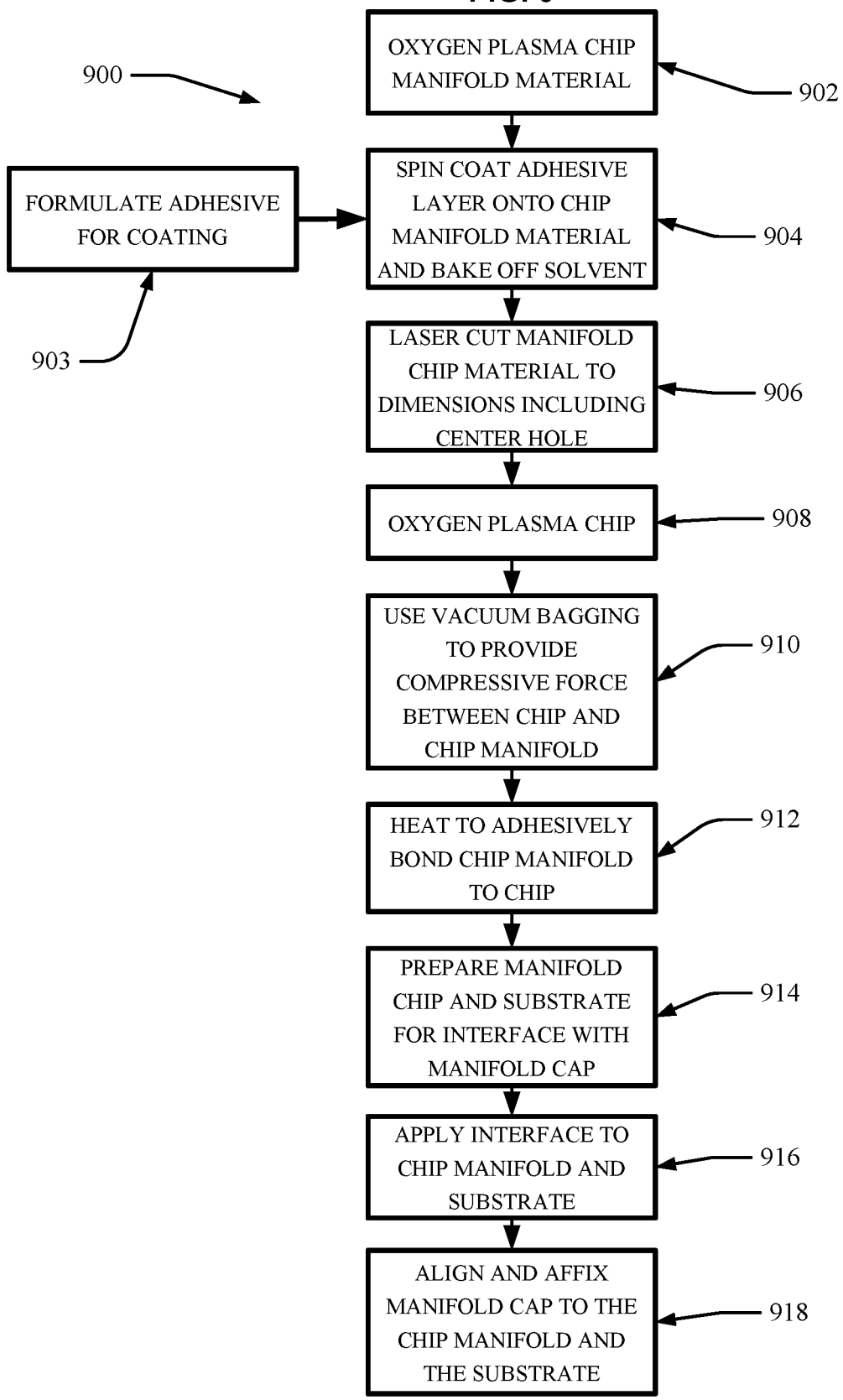
FIG. 9 illustrates a flow diagram of an example, non-limiting method that facilitates assembly of a device having an integrated cooling architecture to implement two-phase cooling in accordance with one or more embodiments described herein.

In reference to FIG. 9, method 900 can exemplify the method 800 of manufacturing the chip package 100. Repetitive description of like elements employed in other embodiments described herein is omitted for sake of brevity.

In 902, the chip manifold material can be cleaned using an oxygen plasma treatment. In 903, an adhesive can be formulated comprising 20% PKHC phenoxy polymer in NMP solvent. In 904 the adhesive can be spin coated onto the chip manifold material, creating a uniform layer of adhesive about 2-5 microns (e.g., 3-4 microns) thick. For example, the spin coating can be performed at 500 revolutions per minute (RPM) for about 10 seconds, 1500 RPMs for about 30 seconds, or other RPM and time period combinations suitable to obtain the desired thickness. Further, the coated chip manifold material can be baked (e.g., about 10 minutes at 100 C° and about 30 minutes at 180 C°) to remove the solvent and form the adhesive layer 206. It is to be appreciated that any suitable RPM and baking temperature for carrying out respective aspects of the herein innovations can be employed and such are intended to fall within the scope of the herein claims. For example, the baking temperature in certain implementations can be within the range of 100 C° to 200 C°.

In 906, the chip manifold material can be laser cut to desired dimensions, including the hole 114, and any debris caused by the laser cutting can be removed. In 908, an oxygen plasma treatment can be utilized to clean the chip 104 in preparation for bonding with the adhesive layer 206.

Figure 10:
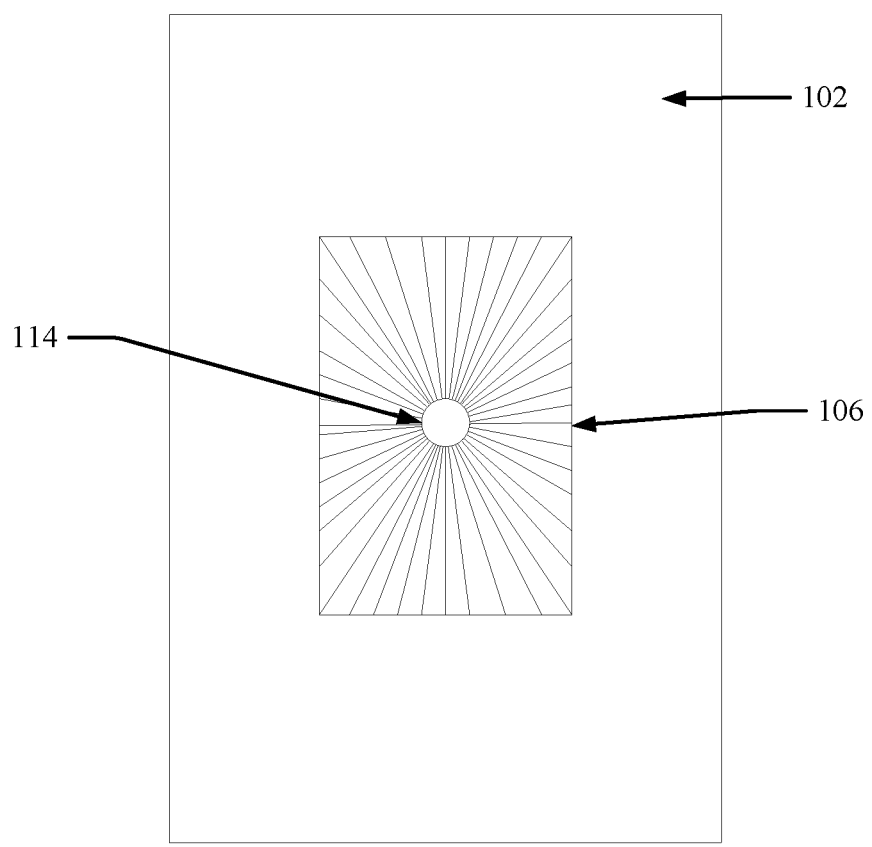
FIG. 10 illustrates a top view of a portion of an example, non-limiting device for implementing two-phase cooling in which a chip manifold is affixed to a chip in accordance with one or more embodiments described herein.

In 910, the chip manifold 106 can be bonded to the chip via vacuum bagging. FIG. 10 illustrates a top view of the chip manifold 106 aligned onto the chip 104. Repetitive description of like elements employed in other embodiments described herein is omitted for sake of brevity. The chip manifold 106, coated with the adhesive layer 206, can be aligned over and placed onto the surface of the chip 104 into which the cooling channels 116 are etched such that the hole 114 in the chip manifold aligns with the central feed area created by the cooling channels 116.

Figure 11:
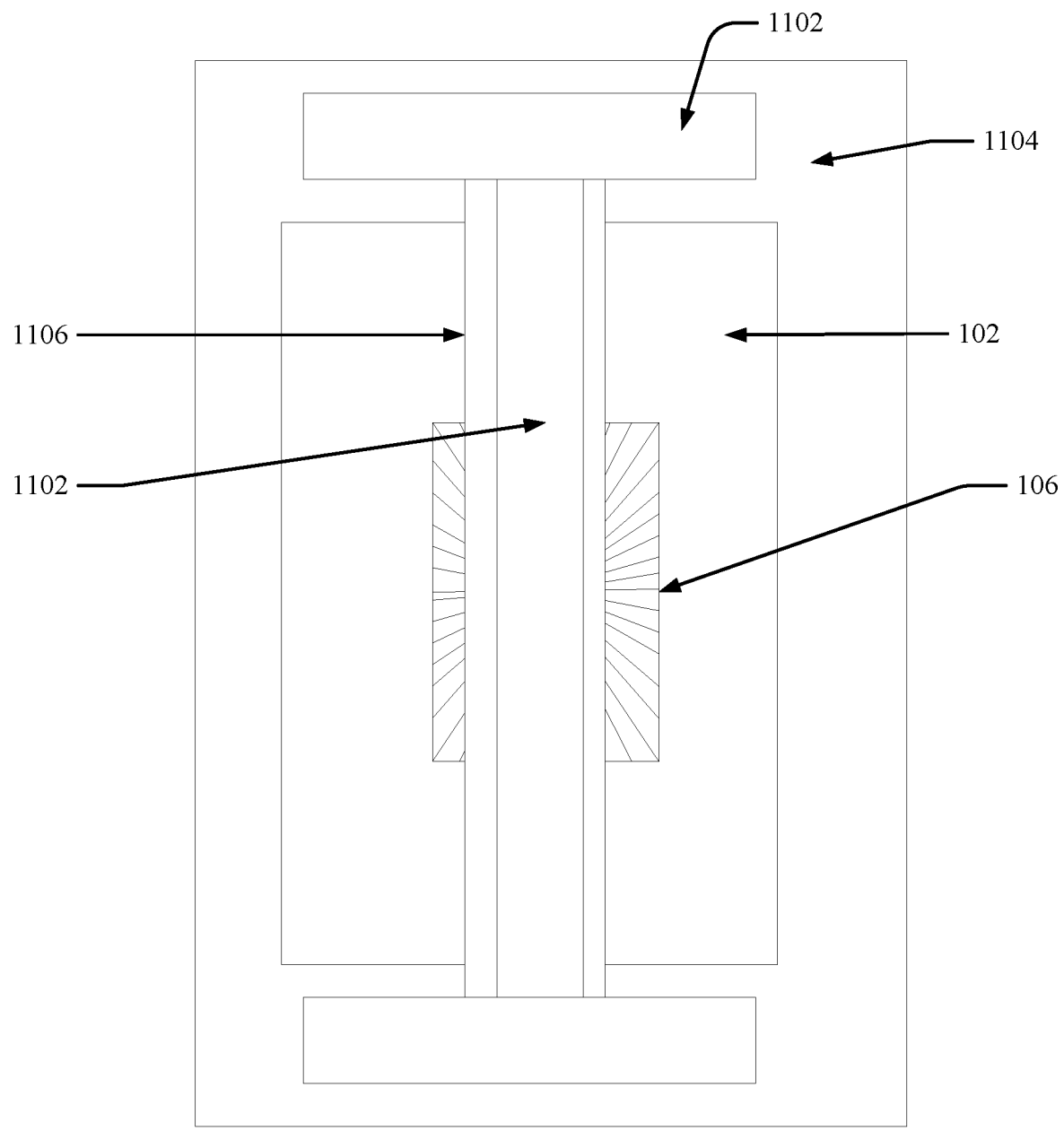
FIG. 11 illustrates a top view of a portion of an example, non-limiting device for implementing two-phase cooling in which a chip manifold, chip, and substrate are prepared for vacuuming bagging in accordance with one or more embodiments described herein.

FIG. 11 illustrates a top view of the chip manifold 106, chip 104, and substrate 102 in preparation for vacuum bagging. Repetitive description of like elements employed in other embodiments described herein is omitted for sake of brevity. Tape 1102 can be placed over the chip manifold 106, chip 104, and substrate 102 to secure the chip manifold 106, chip 104, and substrate 102 to a rigid backing 1104. A release sheet 1106 can be placed between the tape 1102 and both the chip manifold 106 and the substrate 102. The release sheet 1106 can prevent distortion of the adhesive bond between the chip 104 and the chip manifold 106 upon removal of the tape 1102. The tape 1102 can keep the chip manifold 106 aligned properly during the vacuum bagging and apply pressure to the chip manifold 106 towards the chip 104.

The taped chip manifold 106, chip 104, and substrate 102 can be placed in a vacuum sealed bag. The vacuum created inside the bag can provide a compressive force between the chip manifold 106 and the chip 104. The compressive force can bend the chip manifold 106 to match the gradient of the warped chip 104 such that the chip manifold 106 and the adhesive layer 206 have a curvature parallel to the curvature of the chip 104.

In 912, the vacuum sealed bag can be heated at 150 C° for 30 minutes and slow cooled to room temperature over 12 hours. It is to be appreciated that any suitable temperature, heating period, and cooling period for carrying out respective aspects of the herein innovations can be employed and such are intended to fall within the scope of the herein claims. For example, the temperature in certain implementations can be within the range of 140 C° to 350 C°. The curing temperature and cooling period can vary depending on the adhesive utilized in the adhesive layer 206.

In 914, the chip manifold 106 and the substrate 102 can be cleaned using a oxygen plasma treatment. Further, the surface of the substrate 102 upon which the chip 104 can be mounted (e.g., the top most surface) can be laminated. Also, the manifold cap 108 can be ultrasonically cleaned in butoxy ethanol/deionized (DI) water and a sonicated DI rinse. The manifold cap 108 can be then rinsed in isopropanol or dimethyl carbinol and blow dried with nitrogen ($N_2$).

Figure 12:
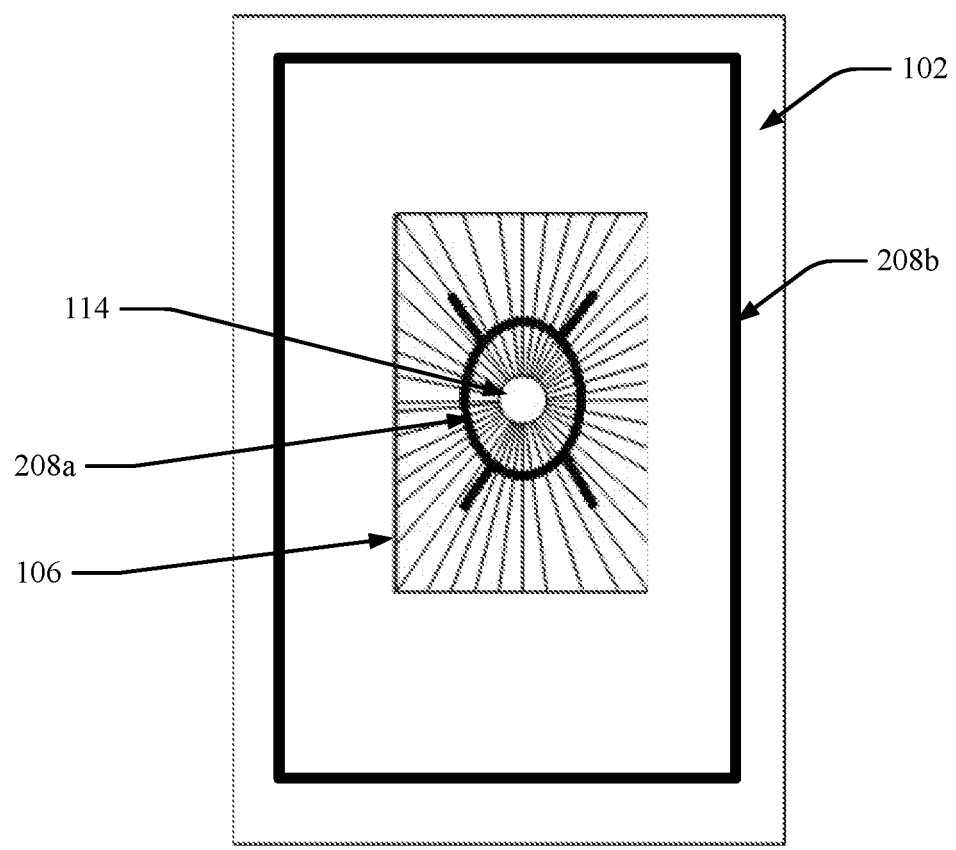
FIG. 12 illustrates a top view of a portion of an example, non-limiting device for implementing two-phase cooling in which an interface is applied to a chip manifold and a substrate in accordance with one or more embodiments described herein.

In 916, the interface 208 can be applied to the first position 208a and the second position 208b. FIG. 12 illustrates a top view of the chip package 100 at 916. Repetitive description of like elements employed in other embodiments described herein is omitted for sake of brevity. The interface 208, at the first position 208a, can be applied such that a first portion of the interface 208 at the first position 208a can encircle the hole 114 in the chip manifold 106. Further, a second portion of the interface 208 at the first position 208a can extend from the first portion of the interface 208 towards each corner of the chip manifold 106. Additionally, the interface 208, at the second position 208b, can be dispensed onto the perimeter of the laminated substrate 102. At the first position 208a, about 28-32 mg of adhesive can be dispensed on the chip manifold 106, wherein the chip 104 can be about 21.2×26.6 mm in size. At the second position 208b, about 500-600 mg of adhesive can be dispensed on the substrate 102, wherein the substrate can be about 50×50 mm in size and the manifold cap 108 can be about 48×48 mm in size. It is understood that the mass dispense of the adhesive can be adjusted for various design dimension.

In 918, the manifold cap 108 can be aligned with the chip manifold 106 and substrate 102 using an alignment fixture. The manifold cap 108 can bond to both the chip manifold 106 and the substrate 102, and cure at room temperature for four days.

In some embodiments, the deck level assembly can comprise a plurality of chips stacked in a vertical orientation as depicted in FIG. 5, wherein in the bottom most chip (e.g., the second chip 504) in the stack of chips 502 can be mounted to the substrate 102 using the techniques described above with regard to 802. Further, a chip manifold 106 can be prepared, cut, and affixed to a top most chip (e.g., chip 104) in the stack of chips 502 using techniques described above with regard to 804, 806, and 808. Additionally, the manifold cap 108 and substrate 102 can be prepared using techniques described above with regard to 810; the interface 208 can be applied using techniques described above with regard to 812; and the manifold cap 108 can be affixed to the substrate 102 using techniques described above with regard to 814.

In some embodiments, the deck level assembly can comprise a plurality of chips arranged in a matrix, as depicted in FIG. 6, with each of the chips (e.g., chip 104 and second chip 604) can be mounted to the substrate 102 using the techniques described above with regard to 802. Further, a plurality of chip manifolds (e.g., chip manifold 106 and additional chip manifold 606) can be prepared, cut, and affixed to respective chips of the plurality of chips (e.g., the chip manifold 106 bonded to the chip 104 and the additional chip manifold 606 bonded to the additional chip 604) using techniques described above with regard to 804, 806, and 808. Additionally, the manifold cap 108 and substrate 102 can be prepared using techniques described above with regard to 810. The interface 208 can be applied to each of the respective manifolds (e.g., the first position 208a and the third position 612) and the substrate 102 (e.g., the second position 208b).

The description of the various embodiments of the present invention have been presented for purpose of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Further, what has been described above include mere examples of devices and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "include," "have," "possess," and the like are used in the detailed description, claims, appendices and drawings such terms are intended to be inclusive in a manner similar to the term "comprising" as "comprising" is interpreted when employed as a transitional word in a claim.

What is claimed is:

1. A device, comprising:
   a chip manifold affixed to a chip, wherein a first area of the chip manifold is less than a second area of the chip;
   an interface layer at a first location between the chip manifold and a manifold cap, wherein the interface layer is a seal; and
   an adhesive layer affixing the chip manifold to the chip, wherein the chip has a curved shape along an exterior boundary of the chip, and wherein the chip manifold is curved with a first curvature that is the same as a second curvature of the chip, wherein the manifold cap comprises an outlet path that surrounds the chip and the chip manifold.

2. The device of claim 1, wherein the interface layer is further at a second location between and directly connecting the manifold cap and a substrate, and wherein the interface layer is distinct from the adhesive layer.

3. The device of claim 1, wherein a value of thickness of the interface layer at the first location decreases as the interface layer approaches a region of the chip manifold.

4. The device of claim 1, wherein the manifold cap has a surface facing the chip manifold.

5. The device of claim 1, wherein the chip comprises one or more radial cooling channels traversing a surface of the chip, and the surface of the chip faces the chip manifold.

6. A device, comprising:
   a chip manifold affixed to a chip, wherein a first area of the chip manifold is less than a second area of the chip;

an interface layer at a first location between the chip manifold and a manifold cap, wherein interface layer is a seal, wherein a material of the interface layer is different from a material of the manifold cap; and an adhesive layer affixing the chip manifold to the chip, wherein the chip has a curved shape along an exterior boundary of the chip, wherein the manifold cap comprises an outlet path that surrounds the chip and the chip manifold.

7. The device of claim 6, wherein the interface layer is further at a second location between and directly connecting the manifold cap and a substrate.

8. The device of claim 7, wherein the interface layer is comprised of an adhesive material.

9. The device of claim 7, wherein the interface layer is a non-adhesive seal at the first location and is comprised of an adhesive material at the second location.

10. The device of claim 6, wherein a value of thickness of the interface layer at the first location decreases as the interface layer approaches a region of the chip manifold.

11. The device of claim 6, wherein the manifold cap has a surface facing the chip manifold.

12. The device of claim 6, wherein the chip comprises one or more radial cooling channels traversing a surface of the chip, and the surface of the chip faces the chip manifold.

* * * * *